(12) United States Patent
Mattia et al.

(10) Patent No.: US 6,211,722 B1
(45) Date of Patent: Apr. 3, 2001

(54) LOW VOLTAGE HIGH SPEED MULTIPLEXER AND LATCH

(75) Inventors: John Paul Mattia, Basking Ridge; Maurice J. Tarsia, Colonia; Venugopal Gopinathan, Basking Ridge, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/273,180

(22) Filed: Mar. 19, 1999

(51) Int. Cl.[7] .............................................. H03K 19/086
(52) U.S. Cl. .......................................... 327/407; 327/408
(58) Field of Search .................................... 327/407, 408, 327/410, 411, 413; 326/126

(56) References Cited

U.S. PATENT DOCUMENTS

| | | | |
|---|---|---|---|
| 4,900,954 | * 2/1990 | Franz et al. | 326/126 |
| 4,963,767 | * 10/1990 | Sinh | 327/411 |
| 5,289,055 | 2/1994 | Razavi | 326/126 |
| 5,402,013 | * 3/1995 | Friedrich | 326/127 |

FOREIGN PATENT DOCUMENTS

355127773 * 10/1980 (JP) ........................ 327/413

* cited by examiner

Primary Examiner—Tuan T. Lam
(74) Attorney, Agent, or Firm—Darby & Darby

(57) ABSTRACT

A high speed and low power digital circuit for producing an output responsive to a plurality of input data signals, such as a multiplexer or a latch includes one or more data switching elements. Each of the switching elements is a differential transistor pair having one transistor driven by a control signal and the other transistor driven by a data signal. The signal levels for the data and control signals are interleaved so that each control signal turns on and off the effect of the data signal on the current flow in the switching element. The circuit structure avoids emitter coupling more than two transistors at any point in order to reduce the capacitance at critical nodes and consequently increase switching speed. By providing two switching elements with data transistors connected to a common pull-down resistor, two data signals, and a complementary pair of control signals, a multiplexing function can be performed. A second pair of similarly connected switching elements can be provided and supplied with inverted input data signals to provide complementary data output signals. The output signals can be cross-coupled to one complementary pair of data inputs to form a high speed, low voltage latch.

10 Claims, 4 Drawing Sheets

LOW VOLTAGE HIGH SPEED MULTIPLEXER AND LATCH

TECHNICAL FIELD

This invention is related to a high speed bipolar logic circuit with a decreased node capacitance providing increased switching speed.

BACKGROUND OF THE INVENTION

Multiplexers and latches are the fastest electronic components in a fiber-optic communication system. Currently, high-speed electronics for these types of systems are limited by the speed of these critical components. Component speed depends on the speed with which the logic circuit can be switched from one state to another and switching speed is dependent on, among other things, the logic voltage swing and the internal capacitances of the circuit.

Shown in FIG. 1a is a conventional high-speed ECL circuit 10 configured for use as a multiplexer. The output voltage appears between nodes X and Y, as voltage drops across resistors 12, 14. The current through each resistor follows alternative paths to the ground ($V_{EE}$). For example, the current from node X may flow into pull-down resistor 28 through either transistors 16 and 24 or transistors 20 and 26. The state of the CK input to transistor 24 and the inverse $\overline{CK}$ input to transistor 26 determines which path is connected to resistor 28, and thereby determines whether the A data input or B data input controls the output.

Each current path includes two transistors in a stacked pair configuration, i.e., the emitter terminal of one transistor is connected to the collector terminal of another transistor. Because each base-emitter junction of a transistor introduces a voltage drop in silicon technology of about 0.8 volts, the power supply voltage must be substantially greater than 1.5 volts if deep saturation of these transistors is to be avoided. This problem is exacerbated in many III–V technologies, where the turn-on voltage is often higher than that in silicon.

FIG. 1b is a known low-voltage logic gate circuit 30 which addresses the problem of the relatively high-voltage power supply required to drive stacked transistors and is described in U.S. Pat. No. 5,289,055 to Razavi. The circuit 30 is configured so that no path between $V_{CC}$ and $V_{EE}$ includes a stacked pair of transistors. Transistors 32 and 34 form a differential pair having A and $\overline{A}$ inputs which are connected to respective transistor bases. Similarly, transistors 36 and 38 form a differential pair having B and $\overline{B}$ inputs connected to respective transistor bases. The emitters of the first differential pair are electrically connected to each other at node M, and the emitters of the second differential pair are connected at node N. Nodes M and N are then electrically connected to $V_{EE}$ through resistors 40 and 42, respectively.

Transistors 32 and 34 are alternately enabled and disabled by clock signal CK applied to the base of transistor 44. When transistor 44 is conducting, the voltage at node M is pulled high, decreasing the magnitude of $B_{BE}$ at the A and $\overline{A}$ inputs. This disables the effect of the A data inputs by preventing transistors 32 and 34 from being activated. Similarly, the effect of the B data inputs applied to transistors 36 and 38 is alternately enabled and disabled by signal $\overline{CK}$ applied to the base of transistor 46 to alter the voltage at node N. The output voltage is taken between nodes X and Y and is dependent on which data input is enabled by the CK signal and the value of that data signal.

Because no path for electric current between $V_{CC}$ and $V_{EE}$ includes a stacked pair of transistors, a power supply voltage (e.g., $V_{CC}-V_{EE}$) as low as 1.5 volts in conventional silicon technology can be used. However, the emitters of three separate transistors are connected to each of nodes M and N, and each transistor contributes a non-negligible amount of additional node capacitance. Thus, the switching speeds of the clocked transistors 44, 46 and the associated data transistors are limited by the combined capacitances at node M and N of the emitters of three separate transistors.

SUMMARY OF THE INVENTION

According to the invention, a high-speed and low-voltage logic circuit, such as a multiplexer or latch, is provided which can operate at speeds in excess of 40 GBit/s using power supplies as low as 4.25 volts, typical for InP-based heterojunction bipolar technology. Instead of gating both a data input and its complement with a single clock-driven transistor, as is in conventional circuits, each data input, whether normal or a data complement, is gated by a separate clock-driven transistor. The data and clock transistors are configured as emitter-coupled differential pairs. Because the clock transistor in each differential pair is connected to only one data transistor, the corresponding node capacitance is reduced when compared with conventional circuit arrangements, thus providing increased switching speed.

In one embodiment of the invention, four such differential pairs are provided. Two differential pairs are driven by the positive clock signal and receive a first data input and its complement. The other two pairs are driven by the inverse clock signal and receive a second data signal and its complement. The voltage signal levels for data and clock signals are interleaved to allow the selected differential pairs to be correctly turned on and off. The output data corresponds to the first or second data input as selected by the value of the clock signal and thus the circuit functions as a multiplexer. Cross-coupling the data outputs to the inputs of the second data signal provides a latch circuit.

According to the invention, a variety of other digital circuits can be configured using this split-clock differential pair arrangement to provide high speed and low voltage operation. By appropriate preconditioning of the output and input signals, such as by level shifting or signal amplification, other logic functions can also be realized.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1A:
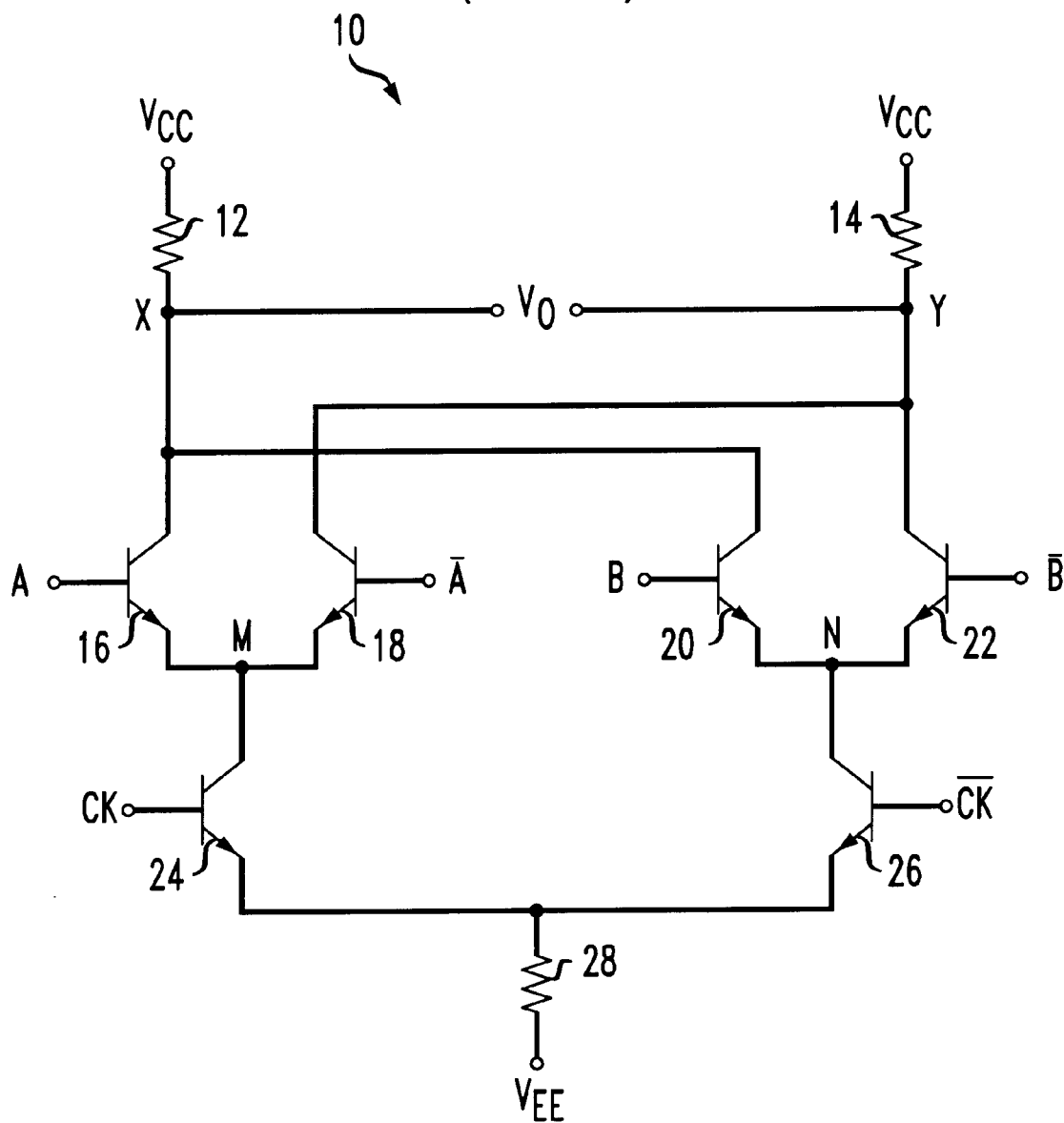
FIG. 1a is a schematic diagram of a conventional multiplexer circuit using differential transistor pairs.
Figure 1B:
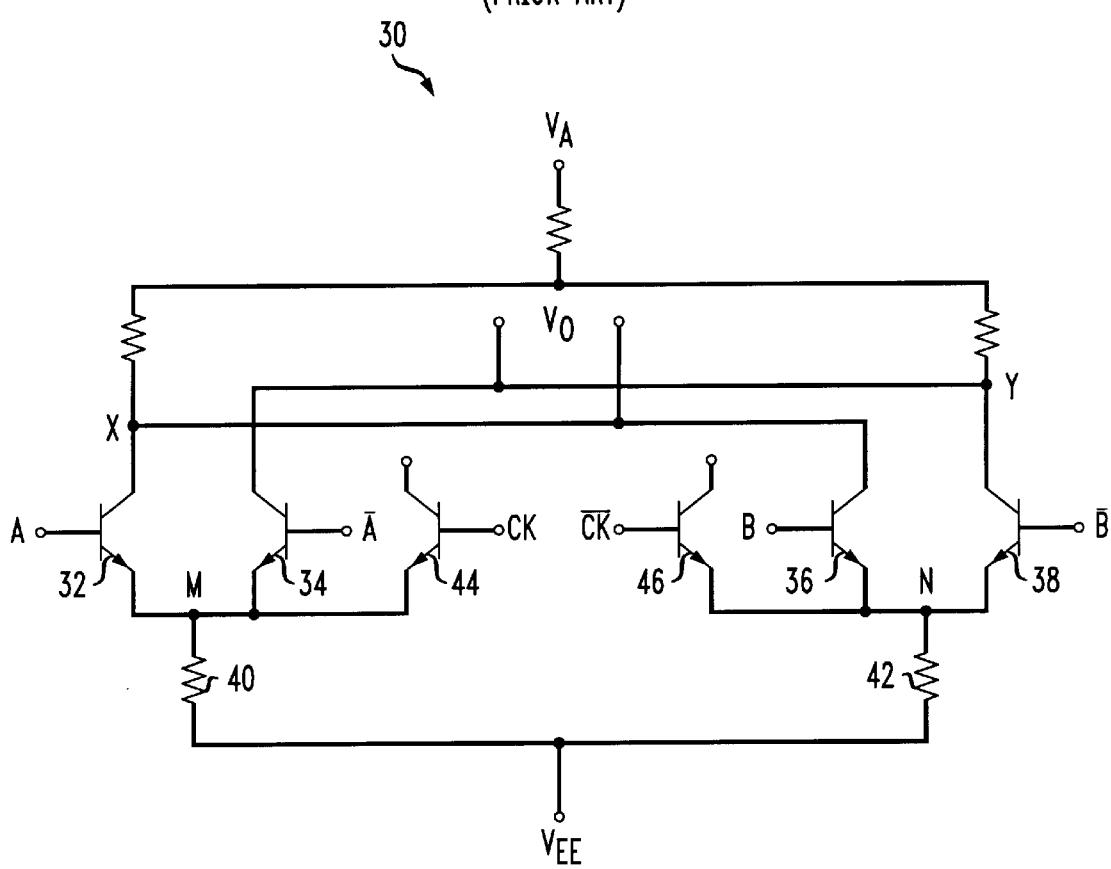
FIG. 1b is a schematic diagram of a prior art multiplexer circuit configured for low-voltage operation.
Figure 2:
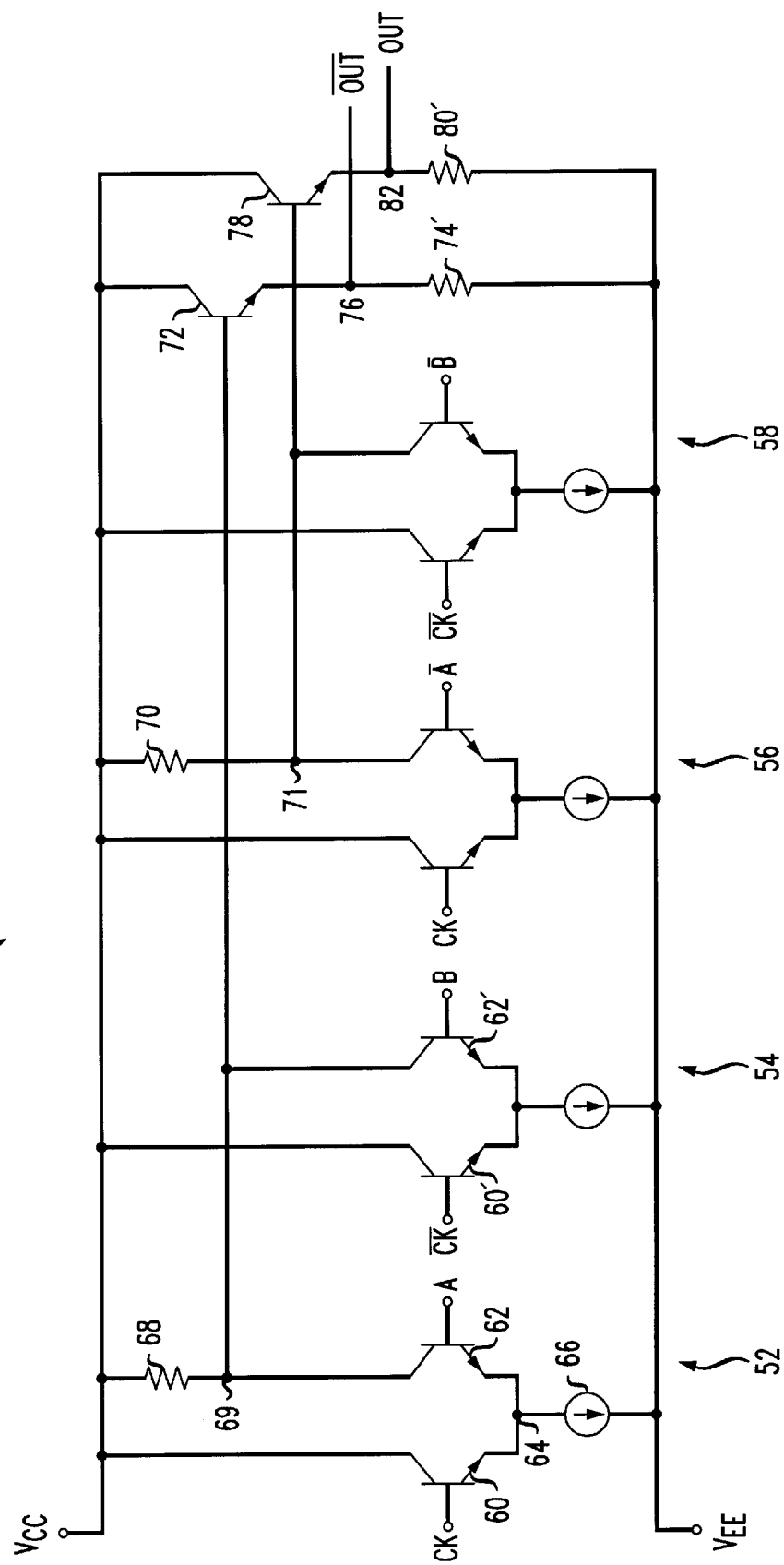
FIG. 2 is a schematic diagram of one embodiment of a multiplexer circuit according to the present invention.

Turning to FIG. 2, there is shown a circuit diagram of a high-speed, low-voltage multiplexer 50 according to the present invention. The multiplexer 50 comprises a plurality of digital data switching elements 52, 54, 56, 58 configured as differential pairs, each of which receives a control signal and a data signal and each of which are connected between a first supply voltage $V_{CC}$ and a second supply voltage $V_{EE}$. The input control signals may be independently controlled.

Each differential pair 52, etc., is configured in generally the same manner, differing in the applied data and control signal inputs. Differential pair 52 includes a selection transistor 60 and a data transistor 62 which are emitter coupled at node 64 to a current sink 66 connected to $V_{EE}$. Current sink 66 is used to generate the bias current for the differential pair and preferably is a resistor. However, other devices, such as properly sized and biased transistors, may be used instead. The collector of transistor 60 is connected to $V_{CC}$ and its base is biased by the application of a control signal CK. The collector of transistor 62 is connected to $V_{CC}$ via a pull-up resistance 68 at data node 69 and is biased by a data input signal A.

The high and low voltage levels for the control signal, $CK_{HIGH}$ and $CK_{LOW}$, and the data signal, $DATA_{HIGH}$ and $DATA_{LOW}$, are interleaved so that when the control signal is high, it exceeds the high data signal level sufficiently to switch the majority of the current through the selection transistor 60 regardless of the value of the input data signal. The low voltage level for the control signal is selected to fall between the high and low voltage levels for the data signal such that when a low control signal is applied, the value of the applied data signal determines whether the current flows through the selection transistor 60 or the data switched transistor 62. In other words, $CK_{HIGH} > DATA_{HIGH} > CK_{LOW} > DATA_{LOW}$. Preferably, the voltage difference between adjacent signal levels is chosen to be great enough to substantially switch the current from one leg of the differential pair to the other. For a transition within 1% of complete, a voltage difference of 5 kT (about 0.6 volts) between signal levels is generally sufficient. However, depending on design considerations such as noise margins, technology, and available voltage headroom, a less complete transition with narrower signal levels can be acceptable.

By selecting appropriate control and data signals and by linking two or more differential pairs through common connections to the data node, a variety of high-speed and low power circuits may be implemented. Unlike in conventional circuits, the combination does not result in a circuit where the outputs of more than 2 switched transistors are connected to a common node, resulting in reduced switching speeds due to the associated capacitances. Instead, each data input transistor is paired with its own selection transistor in a differential pair so that the node capacitance at the emitter-coupling point (node 64) is lower then in analogous conventional circuits, and therefore for same size transistors, the switching speed is increased.

In the circuit shown in FIG. 2, two differential pairs 52, 54 are connected to a shared data node 69 and receive control and data signals to implement a multiplexing function. Differential pair 54 has its own selection transistor 60' biased by a control signal $\overline{CK}$, which is the logical inverse of signal CK applied to selection transistor 60 in differential pair 52. A data transistor 62' is biased by a second data input signal B. The voltage at node 69 is therefore controlled by the inputs to both of the differential pairs.

Preferably, the voltage at data node 69 is buffered by an output buffer. The output buffer is preferably non-inverting and comprises output transistor 72 connected to pull-down resistor 74. The buffered output is extracted at node 76, i.e., the emitter of the transistor 72, and is designated $\overline{OUT}$ in the figure. An inverting output buffer may be used instead if desired. In addition, if the data output is to be used as a subsequent data input to a circuit according to the invention, such as in the latch circuit of FIG. 3, discussed below, the component values should be chosen to provide the proper voltage levels $DATA_{HIGH}$ and $DATA_{LOW}$. Alternatively, voltage level shifting may be performed and various methods of high speed level shifting are known to those of skill in the art.

In operation, the when control signal CK input is high, it dominates the A data input voltage. Therefore, it disables the effect of the A data input on the current flow in the differential pair and thus the voltage at data node 69. However, the complementary $\overline{CK}$ input to the transistor 60' in differential pair 54 is low and thus the value of input data signal B dominates the operation of this circuit element. If B is high, current flows through the data transistor 62', pulling down the voltage at node 69. If B is low, current flows through the selection transistor 60', resulting in a high voltage at node 69. The voltage at node 69 therefore represents the inverse of input signal B. When the CK input is low, the situation is reversed; the B input data value to differential pair 54 is masked and the voltage at node 69 is the inverse of data input A. Accordingly, differential pairs 52 and 54 function as an inverting multiplexer with the CK signal selecting either the B input (CK high) or the A input (CK low) as the output.

In the preferred embodiment shown in FIG. 2, the circuit 50 is configured to provide complementary output signals through the use a second set of differential pairs 56 and 58. Differential pairs 56 and 58 are similar to pairs 52 and 54, respectively, but are connected to a separate pull down resistor 70 at a secondary data node 71 and provide a complementary output based on received inverted data inputs $\overline{A}$ and $\overline{B}$. The voltage at node 71 is preferably buffered by an output buffer comprising output transistor 78 connected to pull-down resistor 80 to provide a second output signal, designated OUT, at node 76.

Complementary output signals provide improved noise immunity, especially for high speed data transfers, since the common-mode of the input signals is rejected. Also, the circuit is preferably configured so that the sum of the currents in each branch of the differential pair is constant, which reduces noise on the power line. It can be appreciated that if differential outputs are not required, pairs 54 and 58 and the associated output buffer element can be eliminated from the circuit.

In the preferred embodiment, the transistors are high speed heterojunction bipolar (HBT) devices fabricated using 3–5 semiconductor technology. Other transistors such as MOS or HEMT devices may also be used. To provide for the fastest switching speed, the devices are preferably manufactured as small as possible. In addition, while resistances 68, 70, 74, and 80 are illustrated as resistors, active devices, such as appropriately biased transistors, can be used instead in a manner known to those of skill in the art.

In a particular implementation, the circuit can be fabricated using an HBT process producing devices having an $f_T$, the frequency at which the current gain goes to one, of approximately 120 GHz and an $f_{MAX}$, the maximum oscillation frequency, of approximately 150 GHz. The transistors are preferably fabricated using the minimum size permitted. In a particular fabrication process, this size is nominally 3×5 microns and results in a base-emitter diode in the transistor having a turn-on voltage of approximately 0.95 V. The load transistors are configured to have a resistance of approximately 50 ohms and each current source is comprised of a transistor, preferably in combination with a 25 ohm resistor connected to the emitter to improve current matching between different branches of the circuit. The circuit is preferably operated with $V_{EE}$ equal to −4.75 V and $V_{CC}$ connected to ground. Under these conditions, the nominal values for the high and low clock level inputs are substantially −1.35 V and −1.75 V, respectively, and the high and low data level imputs are substantially −1.55 V and −1.95 volts, respectively.

Figure 3:
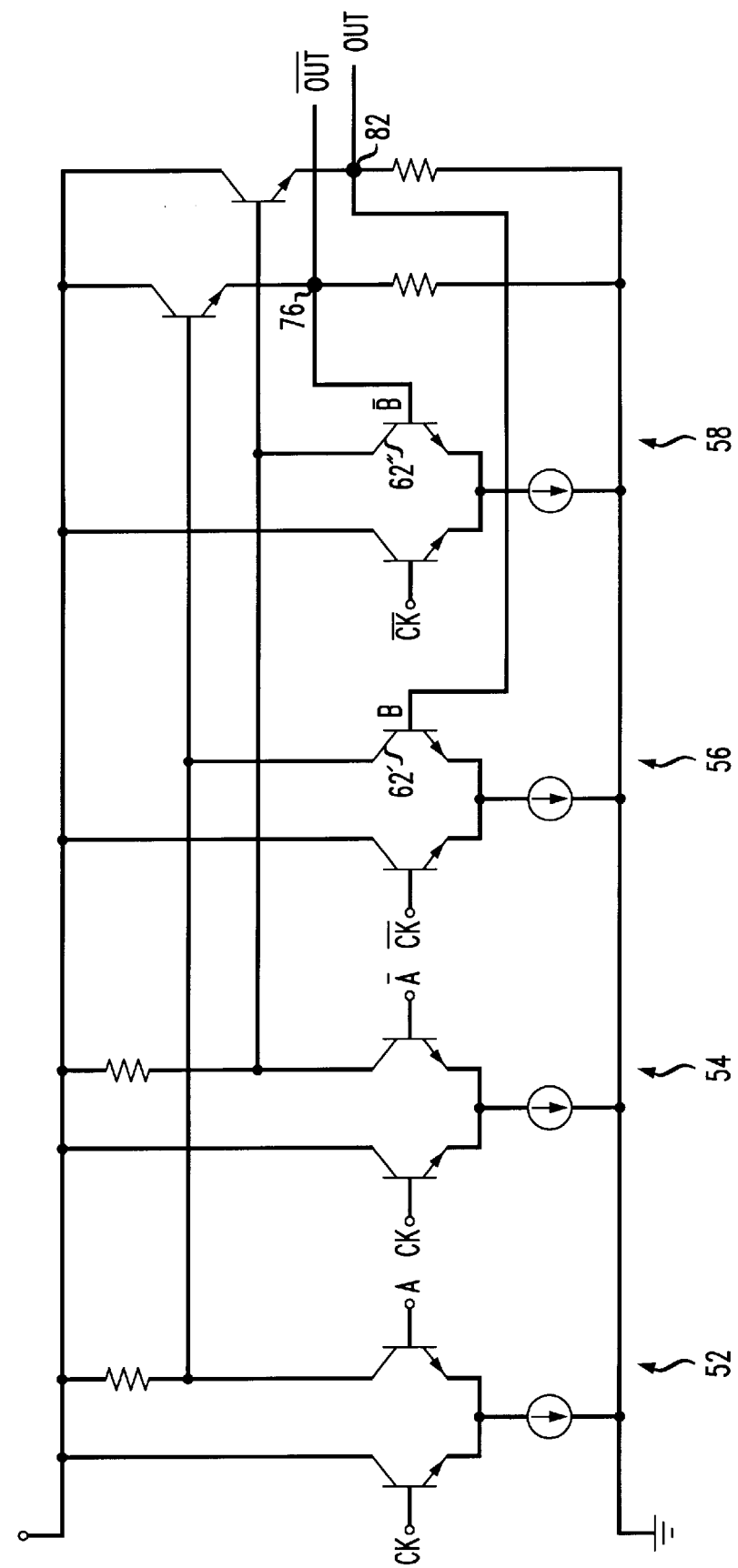
FIG. 3 is a schematic diagram of the circuit of FIG. 2 configured to operate as a latch.

FIG. 3 is a circuit diagram of a high-speed, low-voltage data latch 51 according to the present invention. The circuit corresponds substantially to the multiplexer circuit of FIG. 2, except that the B and $\overline{B}$ data signals, which are input to data transistors 62' and 62" in differential pairs 56 and 58 respectively, are cross coupled to the output nodes 82 and 76 (OUT and $\overline{OUT}$). Data is provided by the A and $\overline{A}$ inputs and gated when CK is low. When CK goes high (i.e., $\overline{CK}$ is low), the B and $\overline{B}$ data signals are fixed by the output, thus latching the input data A. (The position of the differential pairs 54 and 56 in the FIG. 3 has been reversed when compared with FIG. 2 in order to emphasize this cross-coupling).

As illustrated, the buffered output signals are preferably the ones which are used for the cross-coupling because the back bias on the collector-base junction of the B-data transistors is increased, thus increasing the speed of response. However, the connection can be made without buffering by connecting node 69 directly to the $\overline{B}$ input and node 71 directly to the B input.

While the invention has been particularly shown and described with reference to preferred embodiments thereof, it will be understood by those skilled in the art that various changes in form and details may be made therein without departing from the spirit and scope of the invention. In particular, while certain data and control signals are indicated as being applied to particular transistors, the designation and meaning of signals, and the wiring between circuit elements, may be modified as desired to achieve high speed circuits which perform different logical functions. Thus, for example, three or more differential pairs 52, etc. may be connected to a common data node to provide a data output which is dependent on the particularly applied data and control signals. The number of possible logic functions which may be implemented can be increased by the use of level shifting techniques to allow data signals to function as control signals and visa versa. In addition, while the circuits have been discussed with respect to HBT devices, other transistors may be used instead, with appropriate adjustments and/or reversals of the interleaved signal levels according to device polarity.

We claim:

1. A digital circuit for producing an output responsive to a plurality of input data signals in accordance with respective data control signals and connected between a first supply voltage node ("$V_{CC}$") and a second supply voltage node ("$V_{EE}$"), the circuit comprising:

a resistance connected between $V_{CC}$ and a data node; and at least one data switching element connected to $V_{CC}$, to $V_{EE}$, and to said data node, the switching element for receiving a respective data signal switchable between a first high voltage level ("$DATA_{HIGH}$") and a first low voltage level ("$DATA_{LOW}$") and a respective control signal switchable between a second high voltage level ("$CK_{HIGH}$") and a second low voltage level ("$CK_{LOW}$"), where $CK_{HIGH} > DATA_{HIGH} > CK_{LOW} > DATA_{LOW}$;

each of said at least one data switching elements comprising:

a current sink connected to $V_{EE}$;

a first transistor connected between $V_{CC}$ and the current sink and controlled by the respective control signal; and a second transistor connected between the data node and the current sink and controlled by the respective data signal.

2. The circuit of claim 1, comprising first and second data switching elements;

said first data switching element receiving a first control signal and a first data signal;

said second data switching element receiving a second data signal and a second control signal which is the logical inverse of said first control signal; and the voltage at said data node indicating the data value of the first data signal when the first control signal is low and the second control signal is high, and indicating the data value of the second data signal when the first control signal is high and the second control signal is low.

3. The circuit of claim 1, further comprising an output buffer connected to the data node and providing a buffered output signal.

4. The circuit of claim 3, wherein the output buffer comprises:

an output buffer transistor connected between $V_{CC}$ and an output node;

an output resistance connected between said output node and $V_{EE}$;

the voltage at said data node being applied to the base of said output buffer transistor.

5. A digital circuit for producing an output responsive to a plurality of input data signals in accordance with respective data control signals and connected between a first supply voltage ("$V_{CC}$") and a second supply voltage ("$V_{EE}$"), the circuit comprising:

a first differential pair comprising a first selection transistor, a first data transistor, and a first current sink;

the first selection transistor being connected between $V_{CC}$ and the first current sink and being controlled by a first data control signal switchable between a first high voltage level ("$CK_{HIGH}$") and a first low voltage level ("$CK_{LOW}$");

the first data transistor connected between a primary data node and the first current sink and being controlled by a first input data signal switchable between a second high voltage level ("$DATA_{HIGH}$") and a second low voltage level ("$DATA_{LOW}$");

a first resistance connected between $V_{CC}$ and the primary data node;

a second differential pair comprising a second selection transistor, a second data transistor, and a second current sink;

the second selection transistor being connected between $V_{CC}$ and the second current sink and being controlled by a second data control signal switchable between $CK_{HIGH}$ and $CK_{LOW}$;

the second data transistor connected between the primary data node and the second current sink and being controlled by a second input data signal having a voltage switchable between $DATA_{HIGH}$ and $DATA_{LOW}$;

the voltage at said primary data node indicating one of the data value of either of said first or second input data signals when $CK_{HIGH} > DATA_{HIGH} > CK_{LOW} > DATA_{LOW}$ and said second data control signal is the logical inverse of said first data control signal.

6. The circuit of claim 5, further comprising an output buffer for buffering the voltage at said primary data node.

7. The circuit of claim 6, wherein said output buffer comprises:

an output buffer transistor connected between $V_{CC}$ and an output node;

an output resistance connected between said output node and $V_{EE}$;

the voltage at said primary data node being applied to the base of said output buffer transistor.

8. The circuit of claim 5, further comprising:

a third differential pair comprising a third selection transistor, a third data transistor, and a third current sink;

the third selection transistor being connected between $V_{CC}$ and the third current sink and being controlled by a third data control signal switchable between $CK_{HIGH}$ and $CK_{LOW}$;

the third data transistor connected between a secondary data node and the third current sink and being controlled by a third input data signal having a voltage switchable between $DATA_{HIGH}$ and $DATA_{LOW}$;

a second resistance connected between $V_{CC}$ and the secondary data node;

a fourth differential pair comprising a fourth selection transistor, a fourth data transistor, and a fourth current sink;

the fourth selection transistor being connected between $V_{CC}$ and the fourth current sink and being controlled by a fourth data control signal switchable between $CK_{HIGH}$ and $CK_{LOW}$; and the fourth data transistor being connected between the secondary data node and the fourth current sink and being controlled by a fourth input signal having a voltage switchable between $DATA_{HIGH}$ and $DATA_{LOW}$.

9. The circuit of claim 8 further comprising:

a first output buffer for buffering the voltage at said primary data node to produce a buffered primary output signal; and a second output buffer for buffering the voltage at said secondary data node to produce a buffered secondary output signal.

10. The circuit of claim 9, wherein:

said buffered primary output signal is the fourth input data signal applied to the fourth data transistor;

said buffered secondary output signal is the third input data signal applied to the third data transistor;

said first and third data control signal comprise a clock signal; and said second and fourth data control signal comprise the logical inverse of said clock signal.

* * * * *